United States Patent
Nago et al.

(10) Patent No.: US 8,658,450 B2
(45) Date of Patent: Feb. 25, 2014

(54) CRYSTAL GROWTH METHOD AND SEMICONDUCTOR LIGHT EMITTING DEVICE

(75) Inventors: Hajime Nago, Kanagawa-ken (JP); Koichi Tachibana, Kanagawa-ken (JP); Toshiki Hikosaka, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/875,560

(22) Filed: Sep. 3, 2010

(65) Prior Publication Data
US 2011/0204411 A1    Aug. 25, 2011

(30) Foreign Application Priority Data
Feb. 24, 2010  (JP) .................. 2010-039174

(51) Int. Cl.
*H01L 21/00* (2006.01)
*H01L 21/20* (2006.01)

(52) U.S. Cl.
USPC ............... 438/46; 257/103; 257/94; 438/478; 438/22

(58) Field of Classification Search
USPC .............. 257/79–103, E33.025, E33.033; 438/46, 478
See application file for complete search history.

(56) References Cited

U.S. PATENT DOCUMENTS

| | | | |
|---|---|---|---|
| 6,316,785 B1 | 11/2001 | Nunoue et al. | |
| 6,472,300 B2 * | 10/2002 | Nikolaev et al. | 438/509 |
| 2002/0045286 A1 * | 4/2002 | Koide et al. | 438/46 |
| 2002/0048836 A1 * | 4/2002 | Kano et al. | 438/46 |
| 2005/0179130 A1 * | 8/2005 | Tanaka et al. | 257/730 |
| 2006/0240584 A1 * | 10/2006 | Fudeta et al. | 438/22 |
| 2006/0270200 A1 * | 11/2006 | Shibata | 438/481 |
| 2008/0048194 A1 * | 2/2008 | Kudo et al. | 257/94 |
| 2010/0270583 A1 * | 10/2010 | Takano et al. | 257/103 |

FOREIGN PATENT DOCUMENTS

| | | |
|---|---|---|
| JP | H3-44919 A | 2/1991 |
| JP | H8-259385 A | 10/1996 |
| JP | 2000-216430 A | 8/2000 |

(Continued)

OTHER PUBLICATIONS

U.S. Appl. No. 13/208,658, filed Aug. 12, 2011, Ono, et al.

(Continued)

*Primary Examiner* — Asok K Sarkar
*Assistant Examiner* — Dmitriy Yemelyanov
(74) *Attorney, Agent, or Firm* — Oblon, Spivak, McClelland, Maier & Neustadt, L.L.P.

(57) ABSTRACT

According to one embodiment, a crystal growth method is disclosed for growing a crystal of a nitride semiconductor on a major surface of a substrate. The major surface is provided with asperities. The method can include depositing a buffer layer on the major surface at a rate of not more than 0.1 micrometers per hour. The buffer layer includes $Ga_xAl_{1-x}N$ ($0.1 \leq x < 0.5$) and has a thickness of not smaller than 20 nanometers and not larger than 50 nanometers. In addition, the method can include growing the crystal including a nitride semiconductor on the buffer layer at a temperature higher than a temperature of the substrate in the depositing the buffer layer.

22 Claims, 5 Drawing Sheets

(56) References Cited

FOREIGN PATENT DOCUMENTS

| | | |
|---|---|---|
| JP | 2004-022563 | 1/2004 |
| JP | 3595277 | 9/2004 |
| JP | 2006-13467 A | 1/2006 |
| JP | 2006-278616 | 10/2006 |
| JP | 2007-254175 | 10/2007 |
| JP | 2008-270689 A | 11/2008 |
| JP | 2009-123717 A | 6/2009 |
| WO | WO 2008/117627 A1 | 10/2008 |

OTHER PUBLICATIONS

Notification of Reason(s) for Refusal issued in corresponding Japanese Patent Application No. 2011-244330 issued Oct. 16, 2012 (with English translation).

Japanese Office Action issued on Dec. 20, 2012 in corresponding Japanese Application No. 2011-244330 (with an English Translation).

\* cited by examiner

CRYSTAL GROWTH METHOD AND SEMICONDUCTOR LIGHT EMITTING DEVICE

CROSS-REFERENCE TO RELATED APPLICATIONS

This application is based upon and claims the benefit of priority from the prior Japanese Patent Application No. 2010-039174, filed on Feb. 24, 2010; the entire contents of which are incorporated herein by reference.

FIELD

Embodiments described herein relate generally to a crystal growth method and a semiconductor light emitting device.

BACKGROUND

Nitride semiconductors used in semiconductor light emitting devices such as a light emitting diode (LED) are crystal-grown on a sapphire substrate by using a metal organic chemical vapor deposition method (hereinafter, referred to as "MOCVD method"), for example. In order to improve the light emitting characteristics of the semiconductor light emitting devices, it is important to improve the crystallinity of the nitride semiconductors.

On the other hand, a technique has been proposed in which a substrate having asperities is used to improve the light extraction efficiency in a semiconductor light emitting device (for example, refer to JP-A 2007-254175 (Kokai)).

However, it is difficult to evenly grow a crystal of a nitride semiconductor on the substrate having asperities because defects such as pits are likely to occur in the crystal on such a substrate. A special technique is required to evenly grow the crystal of the nitride semiconductor on the substrate having the asperities.

DETAILED DESCRIPTION

Figure 1A:
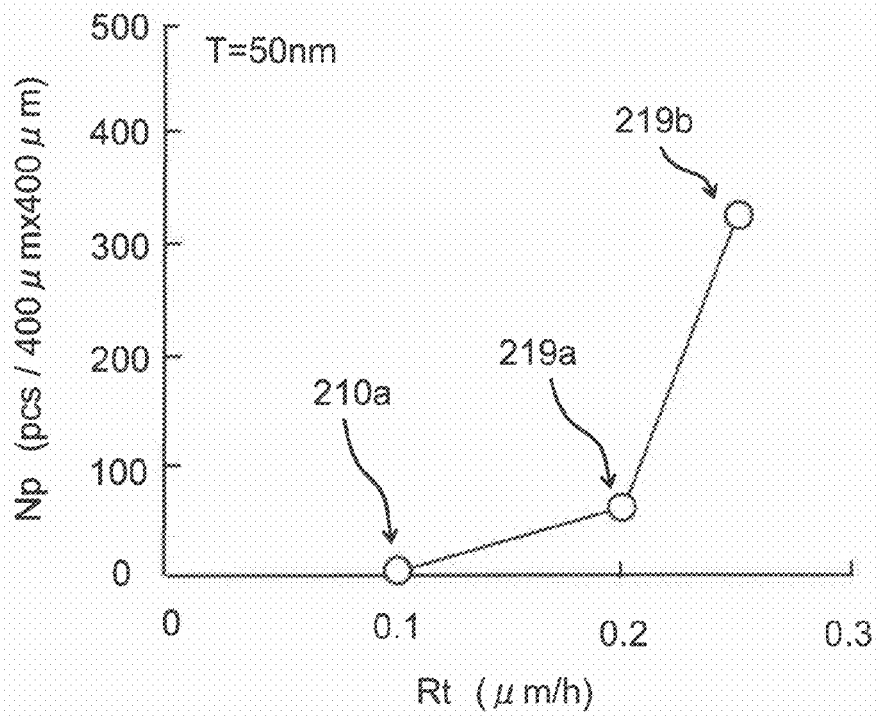
FIG. 1A and FIG. 1B are graphs showing experimental results on a crystal growth method.

In general, according to one embodiment, a crystal growth method for growing a crystal of a nitride semiconductor is disclosed. The method can include depositing a buffer layer a major surface of a substrate at a depositing rate of not more than 0.1 micrometers per hour. The buffer layer includes $Ga_xAl_{1-x}N$ ($0.1 \leq x < 0.5$) and has a thickness of not smaller than 20 nanometers and not larger than 50 nanometers. The substrate has asperities provided on the major surface. In addition, the method can include growing the crystal on the buffer layer at a temperature higher than a temperature of the substrate in the depositing of the buffer layer.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

(Embodiment)

Figure 1B:
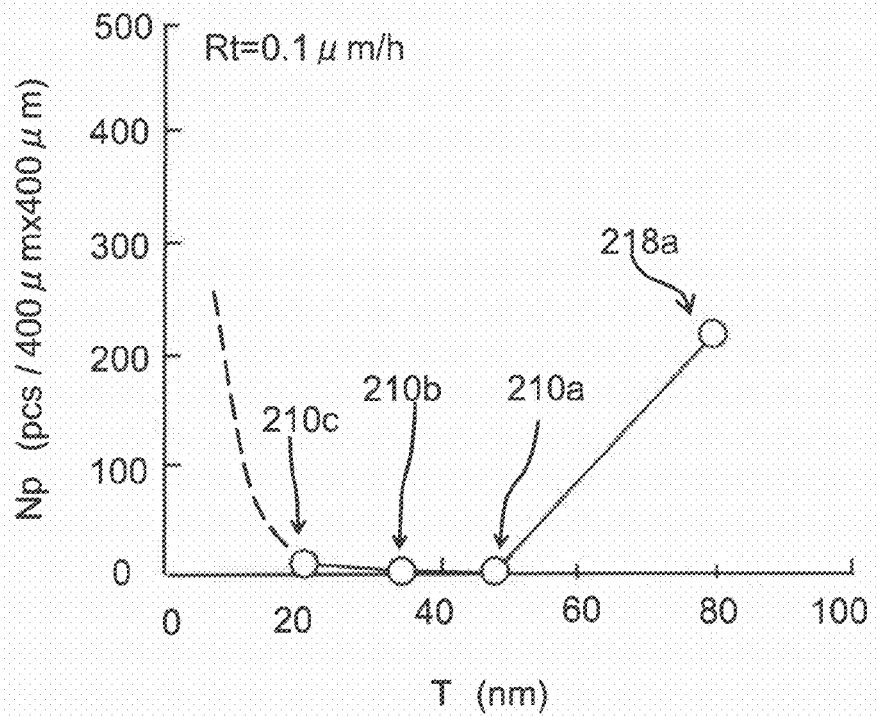

FIG. 1A and FIG. 1B are graphs illustrating experimental results on a crystal growth method according to an embodiment of the invention.

Figure 2:
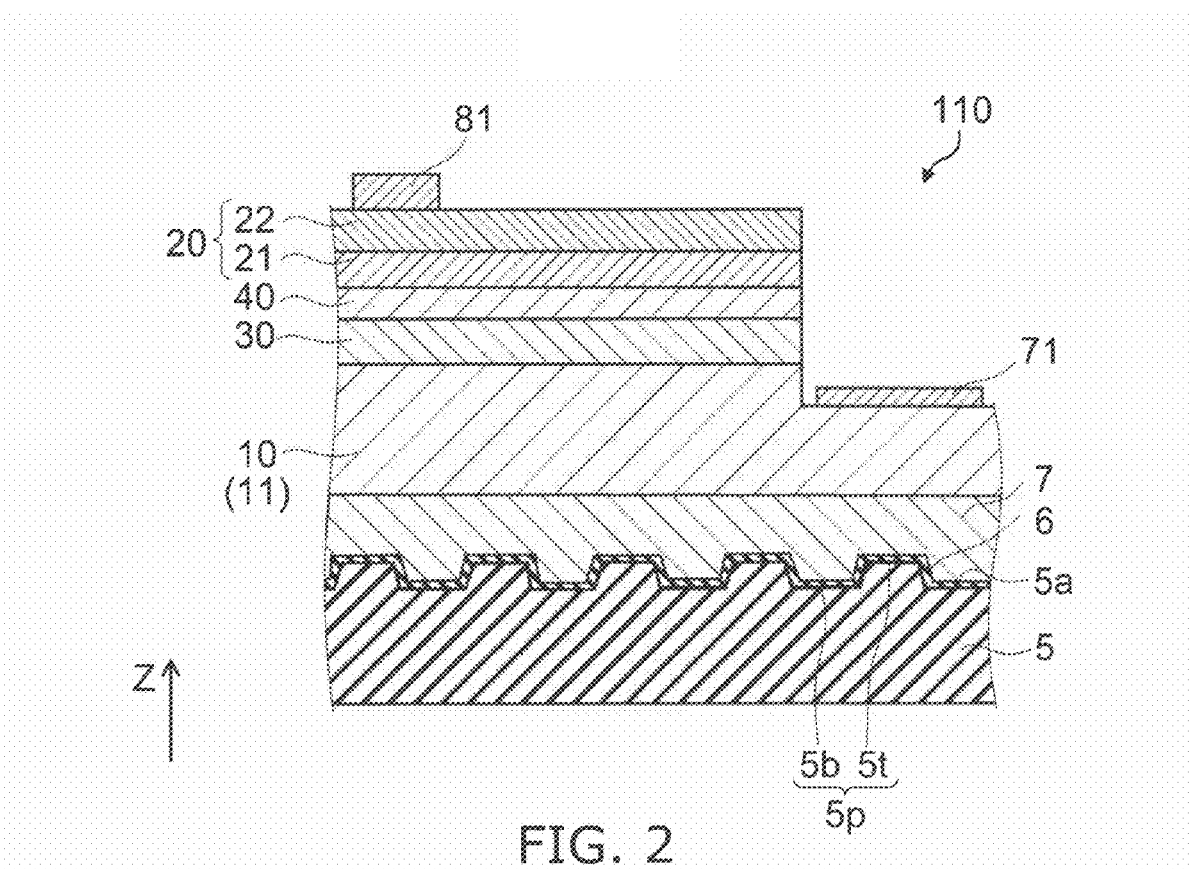
FIG. 2 is a schematic cross-sectional view showing a semiconductor light emitting device to which the crystal growth method is applied.

FIG. 2 is a schematic cross-sectional view illustrating the configuration of a semiconductor light emitting device to which the crystal growth method according to the embodiment of the invention is applied.

Figure 3:
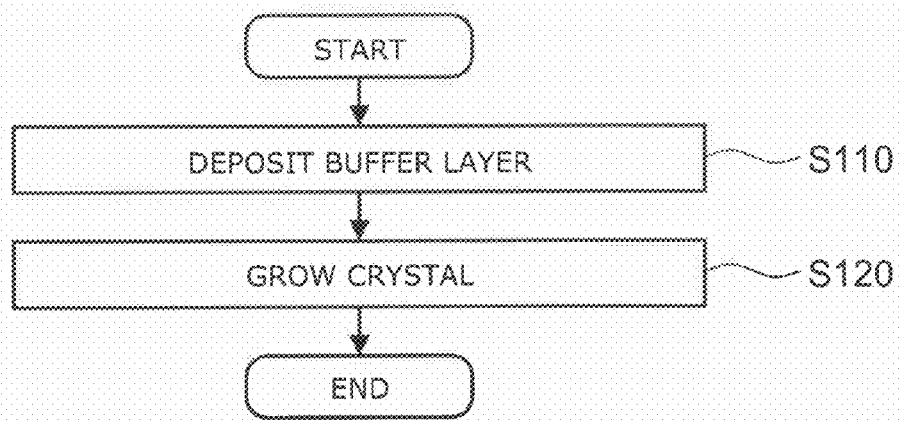
FIG. 3 is a flowchart showing the crystal growth method.

FIG. 3 is a flowchart illustrating the crystal growth method according to the embodiment of the invention.

Figure 4A:
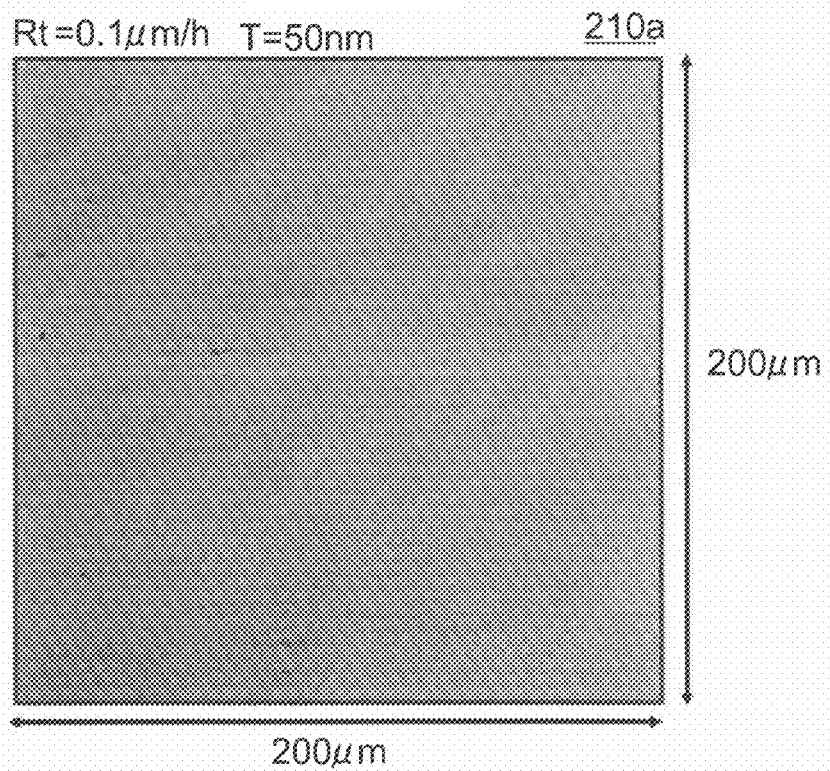
FIG. 4A and FIG. 4B are microscope photographs showing experimental results on the crystal growth method.
Figure 4B:
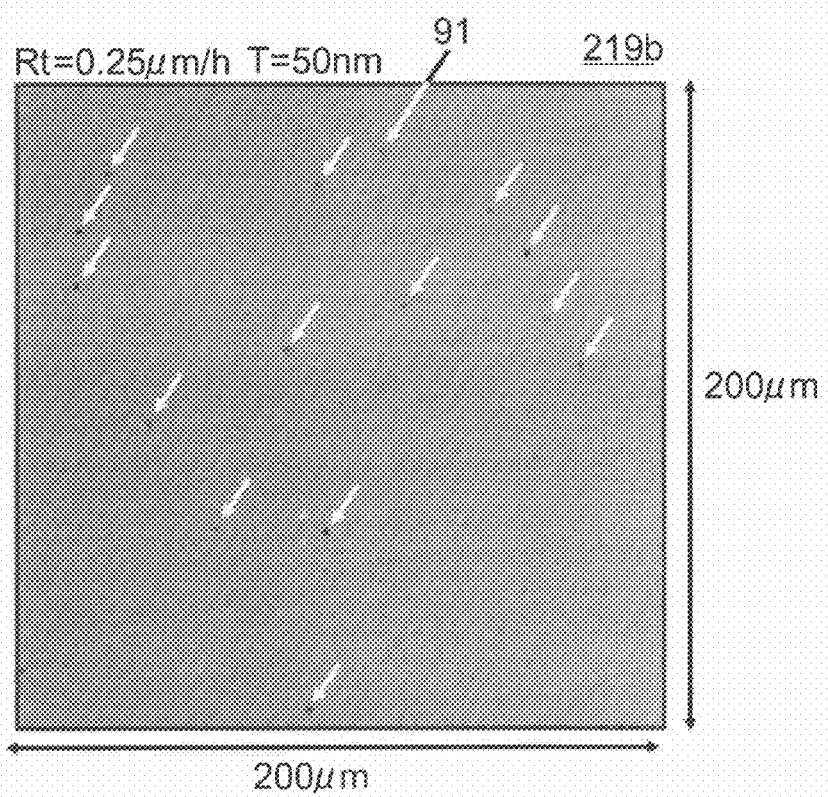

FIG. 4A and FIG. 4B are microscope photographs illustrating experimental results on the crystal growth method.

First, an example of the configuration of a semiconductor light emitting device to which the crystal growth method according to the embodiment of the invention is applied will be described with reference to FIG. 2.

As shown in FIG. 2, the semiconductor light emitting device 110 to which the crystal growth method according to the embodiment is applied includes an n-type semiconductor layer 10 including a nitride semiconductor, a p-type semiconductor layer 20 including a nitride semiconductor, and a light emitting portion 30 provided between the n-type semiconductor layer 10 and the p-type semiconductor layer 20. The light emitting portion 30 includes, for example, multiple barrier layers (not illustrated) and a well layer (quantum well layer, not illustrated) provided between each two adjacent barrier layers.

In this specific example, the n-type semiconductor layer 10 includes an n-type GaN contact layer 11. The p-type semiconductor layer 20 includes a p-type GaN contact layer 22 and a p-type AlGaN electron barrier layer 21 provided between the p-type GaN contact layer 22 and the light emitting portion 30. Additionally, in this specific example, an intermediate layer 40 such as an AlGaN layer is further provided between the light emitting portion 30 and the p-type semiconductor layer 20.

The n-type semiconductor layer 10 is provided with an n-side electrode 71, and the p-type semiconductor layer 20 is provided with a p-side electrode 81. When voltage is applied between the n-side electrode 71 and the p-side electrode 81, light is emitted at the light emitting portion 30 by the recombination of holes and electrons.

As illustrated in FIG. 1, the n-type semiconductor layer 10, the light emitting portion 30, and the p-type semiconductor layer 20 are crystal-grown on a substrate 5 made of sapphire or the like.

Asperities 5p are provided on a major surface 5a of the substrate 5. The asperities 5p cause the traveling direction of the light emitted from the light emitting portion 30 to change, thereby improving the light extraction efficiency.

The asperities 5p include protruding portions 5t and recessing portions 5b. The recessing portions 5b are portions other than the protruding portions 5t. The protruding portions 5t each have a column-like shape with a diameter of 3 micrometers (μm) and a height of 1 μm. The multiple protruding portions 5t are provided on the major surface 5a of the substrate 5 at an arrangement pitch of, for example, 5 μm. However, the crystal growth method according to the embodiment is not limited to this. The asperities 5p (protruding portions 5t and recessing portions 5b) provided in the major surface 5a of the substrate 5 may have any pattern shape, size (height and depth), arrangement pitch, and the like. For example, from the view point of the light extraction efficiency, the asperities 5p should have a height (or the depth) of about not less than 0.5 μm and not more than 2 μm, a width of not less than 0.5 μm and not more than 5 μm, and an arrangement pitch of about not less than 1 μm and not more than 8 μm. However, the embodiment is not limited to this.

When a crystal of a nitride semiconductor is grown on the major surface 5a of the substrate 5 having such asperities 5p, the following is performed in the crystal growth method according to the embodiment.

Specifically, as shown in FIG. 3, a buffer layer 6 is deposited on the major surface 5a of the substrate 5 at a rate (hereinafter, also referred to as a deposition rate or depositing rate) of 0.1 micrometers per hour (μm/h) or less. The buffer layer 6 includes $Ga_xAl_{1-x}N$ (0.1≤x<0.5) and has a thickness (e.g., average thickness) of not smaller than 20 nanometers (nm) and not larger than 50 nm (step S110).

Then, a crystal including a nitride semiconductor is grown on the buffer layer 6 at a temperature higher than the temperature of the substrate 5 during the deposition of the buffer layer (step S120).

The crystal including a nitride semiconductor in this case includes a non-doped GaN layer which is to be a base layer 7.

As described above, the buffer layer 6 is a low-temperature grown buffer layer. The temperature (temperature of the substrate 5) for crystal growth of the buffer layer 6 is, for example, below 800° C., and is, for example, about 600° C. or lower. More specifically, the temperature for crystal growth of the buffer layer 6 is about 500° C.

On the other hand, on the buffer layer 6 grown at such a low temperature, the crystal of a nitride semiconductor (for example, the non-doped GaN layer to be the base layer 7) is grown at a temperature higher than the growth temperature of the buffer layer 6.

Specifically, the temperature (the temperature of the substrate 5) during the crystal growth performed on the buffer layer 6 is, for example, 800° C. or higher.

The crystal of the nitride semiconductor described above may include at least any of the aforementioned n-type semiconductor layer 10, light emitting portion 30, p-type semiconductor layer 20, intermediate layer 40, and the like, in addition to the non-doped GaN layer to be the base layer 7. In addition to these, the crystal of the nitride semiconductor may include a crystal layer of any nitride semiconductor.

For example, metal organic chemical vapor deposition (MOCVD) is used for the deposition of the buffer layer 6 and the growth of the crystal of the nitride semiconductor. For example, the deposition of the buffer layer 6 and the growth of the crystal of the nitride semiconductor can be continuously performed in the same reaction chamber (without taking the substrate 5 out of the reaction chamber).

The buffer layer 6 including $Ga_xAl_{1-x}N$ (0.1≤x<0.5) is deposited at the deposition rate of 0.1 μm/h or less with a thickness of not smaller than 20 nm and not larger than 50 nm. Thereby, occurrence of crystal defects such as pits in the crystal of the nitride semiconductor can be suppressed. In other words, it is possible to grow a uniform crystal on a substrate with asperities according to this manufacturing method.

The above-described conditions for the crystal growth according to the embodiment have been drawn from the following experimental results.

The inventors deposited the buffer layer 6 under various deposition conditions on the major surface 5a of the substrate 5 which was made of sapphire and provided with the multiple columnar protruding portions 5t as the asperities 5p. The protruding portions 5t had a diameter of 3 μm and a height of 1 μm and were disposed at a pitch of 5 μm. Then, the inventors examined pits in the crystal of the nitride semiconductor formed on the buffer layer 6.

In this experiment, the substrate 5 processed by organic cleaning and acid cleaning was placed on a susceptor in a reaction chamber of a MOCVD apparatus. The substrate 5 was heated by the susceptor heated by a high frequency. Next, the major surface 5a of the substrate 5 was subjected to vapor phase etching by increasing the temperature up to 1100° C. in about ten minutes in a hydrogen atmosphere under atmospheric pressure. Thereafter, the substrate 5 was maintained in the above-described state for ten minutes. Thereby, a natural oxide film formed on the surface was removed.

Subsequently, the temperature of the substrate 5 was decreased to 500° C., and raw material gases were then introduced into the reaction chamber to deposit the buffer layer 6. At this time, various types of buffer layers 6 were deposited at different deposition rates by changing the flow rate of trimethylgallium (TMG) gas and the flow rate of trimethylaluminum (TMA) gas, while keeping the flow rate of ammonia gas at 9.5 standard liter/min (slm), the flow rate of hydrogen gas at 15.5 slm, and the flow rate of nitrogen gas at 5.0 slm.

Specifically, three conditions for the gas flow rates were used. They were: a condition in which the flow rate of TMG gas was 7.65 standard cc/min (sccm) and the flow rate of TMA gas was 40 sccm; a condition in which the flow rate of TMG gas was 15.3 sccm and the flow rate for TMA gas was 80 sccm; and a condition in which the flow rate for the TMG gas was 19.1 sccm and the flow rate for the TMA gas was 100 sccm.

The partial pressures of the TMG gas at this time were 0.00025, 0.00051, and 0.00063, respectively. The partial pressures of the TMG gas is defined as a ratio of a flow rate of the TMG gas to a flow rate of a total of the used gas including the TMG gas. For example, when the flow rate of ammonia gas at 9.5 slm (=9500 sccm), the flow rate of hydrogen gas at 15.5 slm (15500 sccm), the flow rate of nitrogen gas at 5.0 slm (5000 sccm), the flow rate of TMG gas at 7.65 sccm and the flow rate of TMA at 40 sccm are used, the partial pressures of the TMG gas is calculated to be about 0.00025.

Moreover, the deposition rates of the buffer layers 6 were 0.1 μm/h under the condition in which the flow rate of TMG gas was 7.65 sccm, 0.2 μm/h under the condition in which the flow rate of TMG gas was 15.3 sccm, and 0.25 μm/h under the condition in which the flow rate of TMG gas was 19.1 sccm. Each of the buffer layers 6 at this time had the same thickness of 50 nm. In other words, the deposition time at this time differed depending on the deposition rate.

In addition, the thicknesses of the buffer layers 6 (average thickness) were changed to 20 nm, 35 nm, 50 nm, and 80 nm by changing the deposition time while keeping the deposition rate of the buffer layers 6 constant at 0.1 μm/h.

The buffer layers 6 formed and deposited as described above are polycrystalline.

After depositing the various types of buffer layers 6 as described above, the temperature of the substrate 5 was increased to 1100° C. Thereafter, the TMG gas was supplied at the flow rate of 60 sccm, and the non-doped GaN layer to be the base layer 7 was formed with a thickness of 3 μm.

Then, while supplying the TMG gas under the same condition, SiH$_4$ was additionally supplied at 20 sccm. Thus, the n-type GaN contact layer 11 included in the n-type semiconductor layer 10 was formed with a thickness of 4 μm. Hereafter, in a case of forming a semiconductor light emitting device, the light emitting portion 30 and the p-type semiconductor layer 20 (the intermediate layer 40 and the like as necessity) are sequentially formed on the n-type GaN contact layer 11. However, in this experiment, evaluations were made on samples each in a state where the n-type GaN contact layer 11 was formed.

FIG. 4A is a differential interference microscope photograph of the crystal of the nitride semiconductor formed under a condition 210a in which the deposition rate Rt of the buffer layer 6 was 0.1 μm/h and the thickness of the buffer layer 6 was 50 nm. FIG. 4B is a differential interference microscope photograph of the crystal of the nitride semiconductor formed under a condition 219b in which the deposition rate Rt of the buffer layer 6 was 0.25 μm/h and the thickness of the buffer layer 6 was 50 nm. These figures are each an observation image with an area of 200 μm×200 μm.

As shown in FIG. 4B, many pits 91 (dark spots in the figure) were formed in the crystal of the nitride semiconductor formed under the condition 219b in which the deposition rate Rt was 0.25 μm/h.

On the other hand, as shown in FIG. 4A, no pit 91 was observed in the crystal of the nitride semiconductor formed under the condition 210a in which the deposition rate Rt was 0.1 μm/h, and no pit 91 was substantially formed. Accordingly, it was found out that the occurrence of the pits 91 largely depended on the deposition rate Rt of the buffer layer 6.

FIG. 1A and FIG. 1B show the experimental results obtained by examining the pits in the crystal of the nitride semiconductor formed on the various buffer layers 6 formed under the conditions different from each other as described above. The horizontal axis of the FIG. 1A represents the deposition rate Rt of the buffer layer 6, and the vertical axis thereof represents the number Np of occurrences of the pits 91 which were observed within an area of 400 μm×400 μm in a plane parallel to the major surface 5a of the substrate 5. The horizontal axis of the FIG. 1B represents the average thickness T of the buffer layer 6, and the vertical axis thereof represents the number Np of occurrences of the pits 91 which were observed within an area of 400 μm×400 μm.

As shown in FIG. 1A, under the condition 219b in which the deposition rate Rt of the buffer layer 6 was 0.25 μm/h, the number Np of occurrences of the pits 91 was 300 or more. The number Np of occurrences was very large. Under a condition 219a in which the deposition rate Rt of the buffer layer 6 was 0.20 μm/h, the number Np of occurrences of the pits 91 was about 60 or more. The number Np of occurrences was smaller than that under the condition 219b. However, the occurrence of the pits 91 was suppressed insufficiently.

In contrast, under the condition 210a in which the deposition rate Rt of the buffer layer 6 was 0.1 μm/h, the number Np of occurrences of the pits 91 was substantially zero. Accordingly, the occurrence of the pits 91 can be suppressed by reducing the deposition rate Rt of the buffer layer 6, specifically by reducing the deposition rate Rt to about 0.1 μm/h. As described above, flatness with favorable surface morphology can be achieved by reducing the deposition rate Rt to about 0.1 μm/h.

On the other hand, as shown in FIG. 1B, in the case where the deposition rate Rt of the buffer layer 6 was 0.1 μm/h and the average thickness T of the buffer layer 6 was changed, the number Np of occurrences of the pits 91 was 200 or more under a condition 218a in which the thickness T was as large as 80 nm.

In contrast, under the condition 210a in which the thickness T was 50 nm and under a condition 210b in which the thickness T was 35 nm, the number Np of occurrences of the pits 91 was substantially zero. Under a condition 210c where the thickness T was 20 nm, the number Np of occurrences of the pits 91 was 10 or less. The number Np of occurrences was very small also in this case.

In the case where the thickness of the buffer layer 6 is 20 nm or smaller, it is considered that the buffer layer 6 was unevenly deposited on the substrate 5. The pits 91 are apt to occur in a crystal grown on such an uneven buffer layer 6.

As illustrated in FIG. 1A and FIG. 1B, it has been found out that both the deposition rate Rt and the average thickness T of the buffer layer 6 needed to be appropriately managed to effectively suppress the occurrence of the pits 91. The condition for the crystal growth method of the embodiment is based on this newly found experimental fact.

Specifically, in the embodiment, the buffer layer 6 including Ga$_x$Al$_{1-x}$N (0.1≤x<0.5) is deposited at the deposition rate Rt of 0.1 μm/h or less with the thickness T of not smaller than 20 nm and not larger than 50 nm. Accordingly, occurrence of crystal defects such as the pits 91 in the crystal of the nitride semiconductor can be effectively suppressed.

By employing the crystal growth method according to the embodiment, it is possible to cover the asperities 5p of the substrate 5 with the buffer layer 6 having the uniform quality and to grow the crystal of the nitride semiconductor in which the occurrence of the pits 91 is suppressed. If there is a portion of the asperities 5p of the substrate 5 not evenly covered with the buffer layer 6 due to a poor coverage with the buffer layer 6, the crystal less grows in the portion than in the other portion. In such a case, a nitride semiconductor, for example, such as a non-doped gallium nitride layer and an n-type contact gallium nitride layer, which is formed on the buffer layer 6, needs to be grown and buried the portion to secure flatness. This causes deterioration in the crystallinity of the nitride semiconductor. The crystal growth method according to the embodiment makes it possible to favorably cover the surface of the asperities 5p of the substrate 5 with the uniform buffer layer 6 and to obtain the crystal of the nitride semiconductor with high crystallinity which has favorable flatness of surface morphology.

When the deposition rate Rt is excessively small, the time required for the deposition of the buffer layer 6 is long and productivity may be deteriorated. For this reason, the deposition rate Rt is set appropriately in view of the productivity. The deposition rate Rt is set to, for example, about not less than 0.03 μm/h and not more than 0.1 μm/h.

Figure 5A:
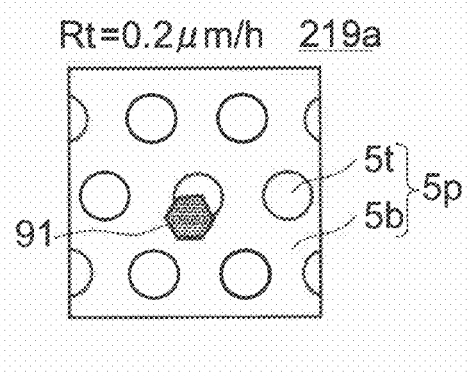
FIG. 5A and FIG. 5B are schematic plan views showing experimental results on the crystal growth method.
Figure 5B:
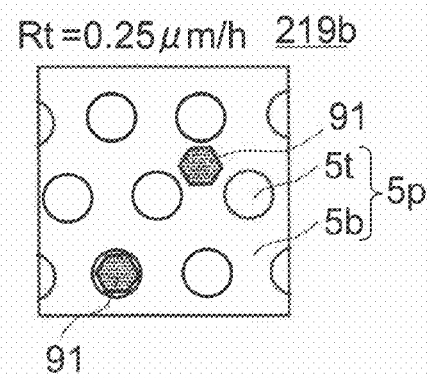

FIG. 5A and FIG. 5B are schematic plan views each illustrating an experimental results on the crystal growth method.

Specifically, FIG. 5A and FIG. 5B illustrate occurrence states of the pits 91 when crystals were observed with a differential interference microscope. The crystals were grown under the condition 219a (the deposition rate Rt of 0.20 μm/h) and the condition 219b (the deposition rate Rt of 0.25 μm/h), which were comparative examples.

As shown in FIG. 5A, when the deposition rate Rt was 0.20 μm/h, the pits 91 were apt to occur in step portions at the boundaries between the protruding portions 5t and the recessing portions 5b of the asperities 5p of the substrate 5.

On the other hand, as shown in FIG. 5B, when the deposition rate Rt was 0.25 μm/h, the pits 91 occurred also in upper surfaces of the protruding portions 5t and lower surfaces of the recessing portions 5b of the asperities 5p of the substrate 5.

The boundary of each pit 91 was a hexagon.

When the deposition rate Rt was as extremely high as 0.25 µm/h as described above, it is considered that the buffer layer 6 was formed unevenly and coarse portions and dense portions occurred in the buffer layer 6. Thus, it is considered that the coverage of the substrate with the buffer layer 6 was uneven. Accordingly, it is considered that cores were hard to form in the upper surfaces of the protruding portions 5t and the lower surfaces of the recessing portions 5b and that the pits 91 occurred in the crystal of the nitride semiconductor beginning at many uneven portions formed in the buffer layer 6. As a result, it is considered that the crystal of the nitride semiconductor which had extremely poor surface morphology was formed.

On the other hand, when the deposition rate Rt was as low as 0.20 µm/h, it is considered that the occurrence of the uneven portions in the buffer layer 6 was suppressed and that the uneven portions limitedly occurred in the step portions at the boundaries between the protruding portions 5t and the recessing portions 5b. As a result, it is considered that the pits 91 existed locally in the step portions at the boundaries between the protruding portions 5t and the recessing portions 5b.

Moreover, in the embodiment, the deposition rate Rt is as low as 0.1 µm/h. Thus, the buffer layer 6 is evenly formed on the substrate 5 having the asperities 5p, and the uneven portions are less likely to occur. Accordingly, the occurrence of the pits 91 is suppressed. In order to secure evenness in the buffer layer 6 as described above, a smaller deposition rate Rt is preferable. It is preferable that the deposition rate is 0.1 µm/h or less.

On the other hand, the number Np of occurrences of the pits 91 was large under the condition 218a in which the deposition rate Rt was 0.1 µm/h and the buffer layer 6 had the large average thickness T of 80 nm. It is considered that this was because the difference between the thickness of the buffer layer 6 in the protruding portions 5t and the thickness of the buffer layer 6 in the recessing portions 5b was large.

Specifically, under the condition 218a in which the average thickness T was 80 nm, the thickness of the buffer layer 6 in the protruding portions 5t was larger than the thickness of the buffer layer 6 in the recessing portions 5b by about 10 nm. Under the condition 210b in which the average thickness T was 50 nm, the thickness of the buffer layer 6 in the protruding portions 5t was larger than the thickness of the buffer layer 6 in the recessing portions 5b by about 7 nm. Under the condition 210a in which the average thickness T was 35 nm, the thickness of the buffer layer 6 in the protruding portions 5t was larger than the thickness of the buffer layer 6 in the recessing portions 5b by about 2 nm. Under the condition 210c in which the average thickness T was 20 nm, the thickness of the buffer layer 6 in the protruding portions 5t was substantially equal to the thickness of the buffer layer 6 in the recessing portions 5b.

Under the condition 219a in which the average thickness T of the buffer layer 6 was 50 nm and the deposition rate Rt was 0.20 µm/h, the thickness of the buffer layer 6 in the protruding portions 5t was larger than the thickness of the buffer layer 6 in the recessing portions 5b by 11 nm.

As described above, the difference between the thickness of the buffer layer 6 in the protruding portions 5t of the substrate 5 and the thickness of the buffer layer 6 in the recessing portions 5b of the substrate 5 was large when the average thickness T of the buffer layer 6 was large. Thereby, it is considered that the property of the buffer layer 6 formed in the protruding portions 5t became different from the property of the buffer layer 6 formed in the recessing portions 5b, and this is considered as one of the reasons why the pits 91 was apt to occur when the buffer layer 6 had the large average thickness T.

Figure 6A:
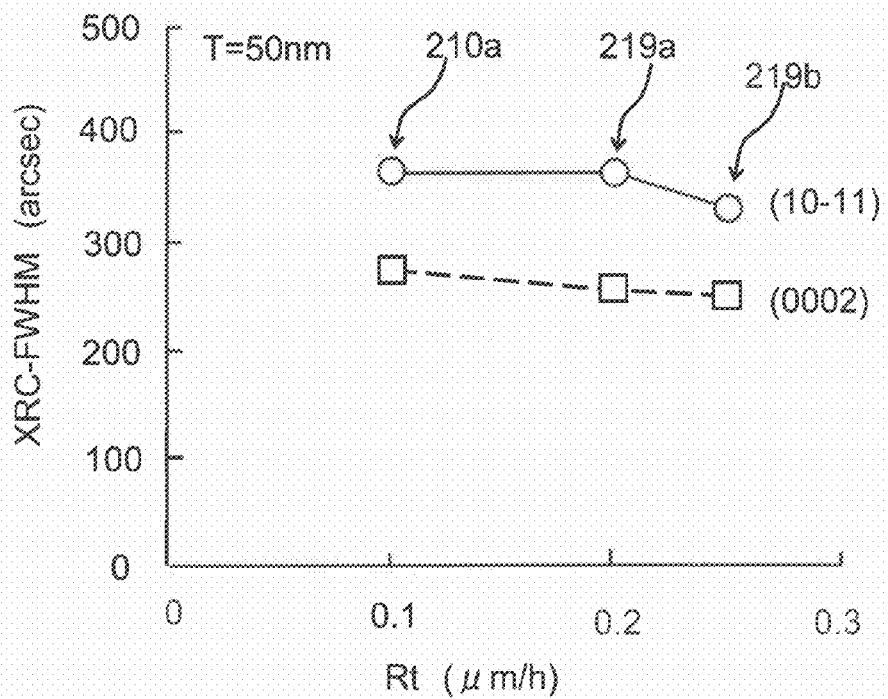
FIG. 6A and FIG. 6B are graphs showing experimental results on the crystal growth method.
Figure 6B:
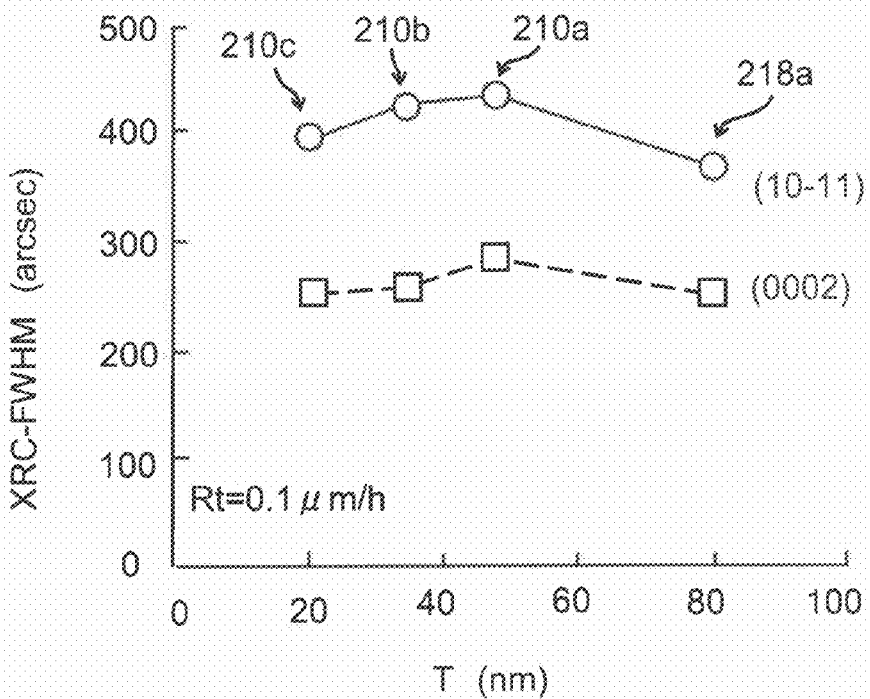

FIG. 6A and FIG. 6B are graphs illustrating experimental results on the crystal growth method.

Specifically, FIG. 6A and FIG. 6B show results of a measurement made on a relationship between the condition for forming the buffer layer 6 and the crystallinity of the crystal of the nitride semiconductor. The vertical axis of each of FIG. 6A and FIG. 6B represents a half-value width WRC-FWHM of an X-ray diffraction rocking curve of the crystal. The horizontal axis of FIG. 6A represents the deposition rate Rt of the buffer layer 6. The horizontal axis of FIG. 6B represents the average thickness T of the buffer layer 6. In these graphs, the half-value width WRC-FWHM in the (0002) symmetry plane of the GaN layer is shown by square symbols, and the half-value width WRC-FWHM in the (10-11) asymmetry plane is shown by round symbols.

As shown in FIG. 6A, when the deposition rate Rt of the buffer layer 6 was reduced to 0.25 µm/h, 0.20 µm/h, and 0.1 µm/h while the average thickness T of the buffer layer 6 was kept at 50 nm, the half-value width WRC-FWHM became slightly larger. Accordingly, the crystallinity evaluated with the half-value width WRC-FWHM became slightly lower.

On the other hand, as shown in FIG. 6B, when the deposition rate Rt of the buffer layer 6 was 0.1 µm/h and the average thickness T of the buffer layer 6 was 50 nm, the half-value width WRC-FWHM was large. Under the condition 218a in which the thickness T was 80 nm, the half-value width WRC-FWHM became smaller. Under the condition 210b in which the thickness T was 35 nm and under the condition 210c in which the thickness T was 20 nm, the half-value widths WRC-FWHM are smaller than when the thickness T was 50 nm. In other words, in a range where the thickness T is 50 nm or less, the half-value width WRC-FWHM became smaller as the thickness T became smaller, and the crystallinity was improved.

For this reason, in order to obtain favorable crystallinity while suppressing the occurrence of the pits 91 at the same time, it is considered that setting the deposition rate Rt of the buffer layer 6 at 0.1 µm/h or less and the average thickness T of the buffer layer 6 at 50 nm or smaller, for example, at about 35 nm is most desirable. In other words, the average thickness T of the buffer layer 6 is desirably set at not smaller than 30 nm and not larger than 40 nm.

It is conceivable that a method of optimizing the crystal growth conditions (type of gas, growth pressure, growth temperature, and the like) of the GaN layer is employed to grow the GaN layer with a flat surface by burying the GaN layer into the asperities 5p of the substrate 5. In other words, it is conceivable that a method of forming a faceted surface by controlling the crystal growth conditions of the GaN layer, and thus promoting growth mainly in a direction parallel to the major surface 5a (in the lateral direction) is employed.

For example, as for the type of gas, it is conceivable: to grow the GaN layer in an atmosphere mainly including a nitrogen gas; to thus promote growth in the lateral direction; and to thereby form the GaN layer, which is a flat buried layer, on the major surface 5a of the substrate 5 having the asperities 5p. However, the surface morphology of the GaN layer grown in the lateral direction is easily affected by the asperities 5p of the substrate 5, and macro asperities are apt to occur in the GaN layer. Thus, the surface morphology of the GaN layer tends to be extremely poor. On the contrary, in the case where the crystal growth method according to the embodiment is applied, the GaN is grown in the atmosphere mainly including a hydrogen gas in which it is harder for the GaN layer to grow in the lateral direction than in the atmosphere mainly using the nitrogen gas. Thereby, an effect is also obtained in which portions of the GaN are more easily buried in the asperities 5p of the substrate 5 to flatten the asperities 5p.

As described above, when the crystal growth method according to the embodiment is applied, the difference between the thickness of the buffer layer 6 in the protruding portions 5t of the asperities 5p and the thickness of the buffer layer 6 in the recessing portions 5b of the asperities 5p is small.

Specifically, a semiconductor light emitting device to which the embodiment is applied includes: the substrate 5 having the major surface 5a which is provided with the asperities 5p having the protruding portions 5t and the recessing portions 5b; the buffer layer 6 which is provided on the major surface 5a of the substrate 5, includes $Ga_xAl_{1-x}N$ ($0.1 \leq x < 0.5$), and has the average thickness of not smaller than 20 nanometers and not larger than 50 nanometers, as well as in which the difference between the thickness in the protruding portions 5t and in the recessing portions 5b is 7 nanometers or smaller; and the crystal including the nitride semiconductors provided above the buffer layer 6 (the n-type semiconductor layer 10, the p-type semiconductor layer 20, the light emitting portion 30 provided between the n-type semiconductor layer 10 and the p-type semiconductor layer 20).

In this semiconductor light emitting device, occurrence of the pits is suppressed while the substrate with the asperities is used. Thus, the uniform crystal can be obtained, and favorable light emitting properties with high light extraction efficiency can be obtained.

Instead of the MOCVD method, any method used for growing a nitride semiconductor, for example, a halide vapor phase epitaxy (HVPE) method, a molecular beam epitaxy (MBE) method, and the like may be used as the crystal growth method according to the embodiment.

Moreover, trimethylgallium (TMG), trimethylaluminum (TMA), trimethylindium (TMI), and biscyclopentadienylmagnesium ($Cp_2Mg$) may be used as the raw material. Ammonia ($NH_3$) and silane ($SiH_4$) may be used as the gas raw material. Hydrogen and Nitrogen may be used as the carrier gas. However, the embodiment is not limited to those described above, and any material for crystal growing a nitride semiconductor may be used. For example, triethylgallium (TEG) may also be used.

Additionally, in the embodiment, any substrate made of GaN, SiC, ZnO, and the like may be used as the substrate 5 instead of the substrate made of sapphire. The plane direction of the major surface 5a of the substrate 5 is not limited to a c-plane. The major surface 5a may be a non-polar plane.

EXAMPLE

Hereinbelow, examples in which the crystal growth method according to the embodiment is applied to a manufacturing of a semiconductor light emitting device 110 will be described.

As described above, the substrate 5 made of sapphire and provided with the multiple columnar protruding portions 5t at an arrangement pitch of 5 μm was processed by the organic cleaning and the acid cleaning. The protruding portions 5t each have a diameter of 3 μm and a height of 1 μm. Thereafter, the substrate 5 was placed on the susceptor in the reaction chamber of the MOCVD apparatus.

Next, the major surface 5a of the substrate 5 was subjected to vapor phase etching by increasing the temperature up to 1100° C. in about ten minutes in the hydrogen atmosphere under atmospheric pressure. Thereafter, the substrate 5 was maintained in the state described above for ten minutes, thereby removing natural oxide formed on the surface.

Subsequently, the temperature of the substrate 5 was decreased to 500° C., and the raw material gases were then introduced into the reaction chamber. Thereby, the buffer layer 6 having a thickness of 20 nm was deposited by setting the flow rate of ammonia gas at 9.5 slm, the flow rate of hydrogen gas at 15.5 slm, the flow rate of nitrogen gas at 5.0 slm, the flow rate of TMA gas at 40 sccm, the flow rate of TMG gas at 7.65 sccm (the partial pressures of TMG gas was 0.00025), and the deposition rate Rt at 0.1 μm/h.

Next, the temperature of the substrate 5 was increased to 1100° C. Thereafter, the TMG gas was supplied at a flow rate of 60 sccm, and the non-doped GaN layer to be the base layer 7 was thus formed with a thickness of 3 μm. Then, while supplying the TMG gas under the same condition, $SiH_4$ was additionally supplied at 20 sccm to form the n-type GaN contact layer 11 with a thickness of 4 μm.

Next, the supply of TMG gas and $SiH_4$ gas was stopped, and the temperature of the substrate 5 was decreased to 800° C. Then, the following layers to be the light emitting portion 30 were formed.

First, the carrier gas was changed only to nitrogen, and the ammonia gas and the TMG gas were introduced at 30 slm and 8 sccm, respectively, to form a GaN barrier layer with a thickness of 5 nm. Then, TMI gas was additionally supplied at a flow rate of 30 sccm to form an InGaN quantum well layer with a thickness of 2.5 nm. Thereafter, the formation of the GaN barrier layer and the formation of the InGaN quantum well layer were repeatedly performed alternately for seven times. After forming the last InGaN quantum well layer, a GaN cap layer was formed with a thickness of 5 nm. Thus, the light emitting portion 30 having a multiple quantum well structure was formed.

Next, the TMA gas was supplied at a flow rate of 4 sccm while the supply of TMG gas was continued as it was. Thus, the intermediate layer 40 of an AlGaN layer was formed with a thickness of 1 nm. Thereafter, the supply of TMG gas and TMA gas was stopped, and the temperature was increased to 1030° C. while the supply of nitrogen gas and ammonia gas was continued as it was.

Next, the flow rate of ammonia gas was changed to 4 slm in the atmosphere including nitrogen and hydrogen while the temperature was maintained at 1030° C. Then, the TMG gas, the TMA gas, and $Cp_2Mg$ gas were supplied into the atmosphere for about two minutes at flow rates of 10 sccm, about 14 sccm, and 50 sccm, respectively. Thus, the p-type AlGaN electron barrier layer 21 was formed with a thickness of 10 nm.

Then, in this state, only the supply of TMA gas was stopped, and the TMG gas was supplied with its flow rate changed to 90 sccm. Thus, the p-type AlGaN electron barrier layer 21 was formed with a thickness of 100 nm.

Next, in this state, the $Cp_2Mg$ gas was supplied with its flow rate changed to 500 sccm. Thus, the p-type GaN contact layer 22 was formed with a thickness of 10 nm.

Then, the supply of the organic metal raw materials was stopped while continuing only the supply of the carrier gas, and the temperature of the substrate 5 was naturally decreased. Note that the supply of ammonia gas was stopped when the temperature of the substrate 5 reached 500° C.

Next, a portion of the multi-layer structure described above was removed by dry etching until reaching the n-type GaN contact layer 11, and the n-side electrode 71 including stacked films of a Ti film/a Pt film/an Au film was formed on the exposed n-type GaN contact layer 11. In addition, the p-side electrode 81 including stacked films of a Ni film/an Au film was formed on the p-type GaN contact layer 22.

Thus, the semiconductor light emitting device 110 was obtained.

The I-V characteristics (current-voltage characteristic) of the semiconductor light emitting device 110 were measured. Favorable ohmic contact without leakage was obtained. In addition, it was confirmed that the surface of an epitaxial layer had extremely flat surface morphology. In this semiconductor light emitting device 110, when the current was 20 milliamperes (mA), the operating voltage was 3.2 V (volts) to 3.4 V and the light output was 15 milliwatts (mW). Moreover, in the light emitted, a peak was confirmed with the wavelength center of 450 nm.

The application of the crystal growth method according to the embodiment allows the asperities 5$p$ of the substrate 5 to be favorably covered with the buffer layer 6, and thus suppresses the occurrence of the pits 91. Thus, a semiconductor light emitting device can be manufactured which includes a crystal of the nitride semiconductor with surface flatness and favorable crystallinity. The manufactured semiconductor light emitting device has no leakage, is excellent in operating voltage, and is highly efficient in light emission.

COMPARATIVE EXAMPLE

As for a comparative example in which the deposition rate Rt was set to 0.2 μm/h, the buffer layer 6 was formed with a thickness of 20 nm, and the other configurations were the same as that of the above-described example, the pits 91 occurred in the crystal of the nitride semiconductor and the surface morphology was poor. As for the I-V characteristics of a semiconductor light emitting device of the comparative example manufactured as described above, leakage occurred in a low current range and favorable ohmic contact was not obtained. In addition, when the current was 20 milliamperes (mA), the operating voltage was 3.3 V to 3.5 V and the light output was 12 mW.

In the specification, "nitride semiconductors" are intended to include semiconductors with all the compositions which are obtained by changing each of composition ratios x, y, and z in the respective ranges in the chemical formula: $B_xIn_yAl_zGa_{1-x-y-z}N$ (0≤x≤1, 0≤y≤1, 0≤z≤1, x+y+z≤1). Furthermore, in the above chemical formula, the "nitride semiconductors" are intended to include ones further containing the group V elements other than N (nitride), ones further containing various elements which are to be added to control various properties such as conductivity types, and ones further containing various elements which are contained unintentionally.

Hereinabove, exemplary embodiments of the invention are described with reference to specific examples. However, the invention is not limited to these specific examples. For example, various modifications made by one skilled in the art in regard to apparatuses used for a crystal growth method, gas raw materials, carrier gases, substrates, processing conditions, and the like are included in the scope of the invention to the extent that the purport of the invention is included.

Further, any two or more components of the specific examples may be combined within the extent of technical feasibility; and are included in the scope of the invention to the extent that the purport of the invention is included.

Moreover, all crystal growth methods practicable by an appropriate design modification by one skilled in the art based on the crystal growth methods described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A crystal growth method for growing a crystal of a nitride semiconductor comprising:
   depositing a buffer layer on a major surface of a substrate at a depositing rate of not more than 0.1 micrometers per hour, the buffer layer including $Ga_xAl_{1-x}N$ (0.1≤x<0.5) and having a thickness of not smaller than 20 nanometers and not larger than 50 nanometers, the substrate having asperities provided on the major surface; and
   growing the crystal on the buffer layer at a temperature higher than a temperature of the substrate in the depositing the buffer layer, wherein said growing the crystal comprises producing said crystal with a pit density of less than 200 pits per 400 μm×400 μm area.

2. The method according to claim 1, wherein
   the depositing the buffer layer includes using a trimethylgallium gas with a partial pressure of not more than 0.00025, the partial pressure being a ratio of a flow rate of the trimethylgallium gas to a flow rate of a total of used gas including the trimethylgallium gas.

3. The method according to claim 1, wherein
   the buffer layer is polycrystalline.

4. The method according to claim 1, wherein
   the temperature of the substrate in the depositing the buffer layer is not higher than 600° C., and
   the temperature of the substrate in the growing the crystal is not lower than 800° C.

5. The method according to claim 1, wherein
   the substrate is a sapphire substrate.

6. The method according claim 1, wherein
   the growing the crystal includes forming a non-doped GaN layer on the buffer layer and forming a GaN layer including Si on the non-doped GaN layer.

7. The method according to claim 6, wherein
   the growing the crystal further includes forming at least one of a light emitting portion and a p-type semiconductor layer on the GaN layer including Si.

8. The method according to claim 1, wherein
   the depositing the buffer layer and the growing the crystal include performing at least one of a metal organic chemical vapor deposition method, a halide vapor phase epitaxy method, and a molecular beam epitaxy method.

9. The method according to claim 1, wherein
   the growing the crystal includes processing using at least one of trimethylgallium, triethylgallium, trimethylaluminum, trimethylindium, biscyclopentadienylmagnesium, ammonia, silane, hydrogen, and nitrogen.

10. The method according to claim 1, wherein the substrate includes at least one of sapphire, GaN, SiC, and ZnO.

11. The method according to claim 1, wherein a reaction chamber in which the growing the crystal is performed is identical to a reaction chamber in which the depositing the buffer layer is performed, and
the growing the crystal is continuously performed with the depositing the buffer layer.

12. The method according to claim 1, wherein the depositing rate of the depositing the buffer layer is not less than 0.03 micrometers per hour.

13. The method according to claim 1, wherein the thickness of the buffer layer is not smaller than 30 nanometers and not larger than 40 nanometers.

14. The method according to claim 1, wherein the asperities include a protruding portion and a recessing portion, and
a difference between a thickness of the buffer layer in the protruding portion and a thickness of the buffer layer in the recessing portion is not larger than 7 nanometers.

15. The method according to claim 1, wherein a height of each of the asperities is not less than 0.5 micrometers and not more than 2 micrometers.

16. The method according to claim 1, wherein a width of each of the asperities is not less than 0.5 micrometers and not more than 5 micrometers, and
an arrangement pitch of the asperities is not less than 1 micrometer and not more than 8 micrometers.

17. The method according to claim 1, wherein the temperature of the substrate in the depositing the buffer layer is not higher than 500° C.

18. The method according to claim 1, wherein the asperities include a protruding portion and a recessing portion, the protruding portion having a flat face,
a height of the asperities is not less than 0.5 μm and not more than 2 μm,
a width of the asperities is not less than 0.5 μm and not more than 5 μm, and
an arrangement pitch of the asperities is not less than 1 μm and not more than 8 μm.

19. The method according to claim 18, wherein a difference between a first thickness of the buffer layer on the protruding portion and a second thickness of the buffer layer on the protruding portion is not more than 7 nm.

20. The method according to claim 19, wherein the asperities covered with the buffer layer are buried by the crystal of the nitride semiconductor so as not to make a space between the crystal and the asperities covered with the buffer layer.

21. The method according to claim 1, wherein said growing the crystal comprises producing said crystal with a pit density of less than 60 pits per 400 μm×400 μm area.

22. The method according to claim 1, wherein said growing the crystal comprises producing said crystal with a pit density of less than 10 pits per 400 μm×400 μm area.

* * * * *